(12) United States Patent
Nitta et al.

(10) Patent No.: US 7,653,889 B2
(45) Date of Patent: Jan. 26, 2010

(54) METHOD AND APPARATUS FOR REPEAT EXECUTION OF DELAY ANALYSIS IN CIRCUIT DESIGN

(75) Inventors: Izumi Nitta, Kawasaki (JP); Toshiyuki Shibuya, Kawasaki (JP); Katsumi Homma, Kawasaki (JP); Hidetoshi Matsuoka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 241 days.

(21) Appl. No.: 11/524,342

(22) Filed: Sep. 20, 2006

(65) Prior Publication Data

US 2007/0226669 A1  Sep. 27, 2007

(30) Foreign Application Priority Data

Mar. 23, 2006  (JP) .............................. 2006-081707

(51) Int. Cl.
  *G06F 17/50* (2006.01)
  *G06F 9/45* (2006.01)
(52) U.S. Cl. ............................................. 716/6; 716/11
(58) Field of Classification Search ....................... None
  See application file for complete search history.

(56) References Cited

U.S. PATENT DOCUMENTS

| 5,397,749 | A | * | 3/1995 | Igarashi | 716/8 |
|---|---|---|---|---|---|
| 5,426,591 | A | * | 6/1995 | Ginetti et al. | 716/6 |
| 5,654,898 | A | * | 8/1997 | Roetcisoender et al. | 716/9 |
| 5,880,967 | A | * | 3/1999 | Jyu et al. | 716/6 |
| 6,209,122 | B1 | * | 3/2001 | Jyu et al. | 716/6 |
| 6,272,668 | B1 | * | 8/2001 | Teene | 716/10 |
| 6,427,226 | B1 | * | 7/2002 | Mallick et al. | 716/10 |
| 7,017,131 | B2 | * | 3/2006 | Barnes | 716/6 |
| 7,222,311 | B2 | * | 5/2007 | Kaufman et al. | 716/2 |
| 7,401,307 | B2 | * | 7/2008 | Foreman et al. | 716/6 |
| 2007/0016881 | A1 | * | 1/2007 | Gregory et al. | 716/6 |
| 2007/0192752 | A1 | * | 8/2007 | Bhattacharya et al. | 716/4 |

OTHER PUBLICATIONS

Nitta et al.; "A Study of the Model and the Accuracy of Statistical Timing Analysis"; IEICE Technical Report, VLD2005-71, ICD2005-166, DC2005-48; pp. 61-66; Dec. 2005.
Shuji Tsukiyama; "Statistical Timing Analysis: A Survey"; The 18$^{th}$ Workshop on Circuits and Systems in Karuizawa; pp. 533-538; Apr. 25-26, 2005.

* cited by examiner

*Primary Examiner*—Leigh Marie Garbowski
(74) *Attorney, Agent, or Firm*—Fujitsu Patent Center

(57) ABSTRACT

An apparatus includes: a detecting unit that detects a target path from among a plurality of paths in a target circuit based on a result of a delay analysis of the target circuit, wherein the result of the delay analysis includes delay data of a first circuit component of the target path; an extracting unit that extracts delay data of a second circuit component having an identical type to that of the first circuit component; and a generating unit that generates a directive for replacing the first circuit component with the second circuit component.

9 Claims, 12 Drawing Sheets

| WIRING LAYER | MEAN | 3σ RATIO |
|---|---|---|
| L1 | 50 | 0.05 |
| L2 | 50 | 0.05 |
| L3 | 30 | 0.03 |
| ⋮ | ⋮ | ⋮ |
| Lg | 30 | 0.03 |
| ⋮ | ⋮ | ⋮ |
| Lz | 40 | 0.04 |

500

| start:FF1<br>end:FF2<br>step | 501 | [step delay] | [total delay] |
|---|---|---|---|
| INST1.X<br>INST2.A<br>INST2.X<br>. .<br>INSTh.X | 502 | 0.00<br>3.00<br>45.00<br><br>. . . | 0.00<br>3.00<br>48.00<br><br>. . . |

```
#SSTA_CASE1
#SSTA_CHANGE_CELL_TYPE  INST1  CELL2
#SSTA_CHANGE_LINE  PIN1  PIN2  120ps  115ps  122ps

#SSTA_CASE2
#SSTA_CHANGE_LINE  PIN1  PIN2  100ps  95ps  105ps
#SSTA_CHANGE_CELL_TYPE  INST2  CELL3
#SSTA_CHANGE_LINE  PIN1  PIN2  100ps  95ps  105ps

. . .

start:FF1
  end:FF2
  step       [step delay]   [total delay]   CASE1    CASE2
  INST1.X    0.00           0.00            0.00     0.00
  INST2.A    3.00           3.00            3.00     3.00      ~901
  INST2.X    45.00          48.00           40.00    43.00
  . . .
  INSTh.X    . . .          . . .           . . .    . . .
```

METHOD AND APPARATUS FOR REPEAT EXECUTION OF DELAY ANALYSIS IN CIRCUIT DESIGN

CROSS-REFERENCE TO RELATED APPLICATIONS

This application is based upon and claims the benefit of priority from the prior Japanese Patent Application No. 2006-081707, filed on Mar. 23, 2006, the entire contents of which are incorporated herein by reference.

BACKGROUND OF THE INVENTION

1. Field of the Invention

The present invention relates to a technology for improving circuit delay of a target circuit by modifying the target circuit and executing a delay analysis of the modified target circuit repeatedly until timing closure is achieved.

2. Description of the Related Art

The development of semiconductor process technology in recent years has led to an increased impact of statistical factors (such as process variation) on the fabrication of very large scale integration (VLSI) circuits. This necessitates in the design of VLSI circuits, for the fabrication of circuits achieving required performance with high yield, a technology for improving circuit delay by taking into account the effect of such statistical factors.

Conventionally, statistical static timing analysis (SSTA) has been proposed in which variations of delay in an integrated circuit (IC) is treated as statistics to calculate delay distribution of the IC. Such a technology is disclosed in, for example, "An Overview of Statistical Timing Analysis" by Shuji Tsukiyama at the 18th workshop on circuits and systems in Karuizawa, Apr. 25-26, 2005. There has been also proposed a method of accurately estimating a slack value by statistically calculating the slack value as a probability distribution in the calculation of delay distribution of an IC. Such a technology is disclosed in, for example, "A Study of the Model and the Accuracy of Statistical Timing Analysis" by Izumi NITTA et al, Singaku-Gihou, IEICE technical report, VLD2005-71, ICD2005-166, DC2005-48 (2005-12).

However, with the conventional technologies, it is difficult to identify which path in the IC should be modified to improve timing of the IC, because the entire IC is statistically analyzed. This necessitates a redesign of the circuit and results in an increased load on a designer and a longer designing period.

On the other hand, all paths in the IC can be improved by static timing analysis (STA) so that the slack value of each path exceeds a target value. However, even when the slack value of each path is improved, timing of the IC may be unimproved due to the nature of the statistical analysis. This necessitates a redesign of the circuit and results in an increased load on a designer and a longer designing period.

SUMMARY OF THE INVENTION

It is an object of the present invention to at least solve the above problems in the conventional technologies.

An apparatus according to an aspect of the present invention executes a delay analysis for improving a delay of a target circuit. The apparatus includes: a detecting unit that detects a target path from among a plurality of paths in the target circuit based on a result of a delay analysis of the target circuit, wherein the result of the delay analysis includes delay data of a first circuit component of the target path; an extracting unit that extracts delay data of a second circuit component having an identical type to that of the first circuit component; a determining unit that determines whether to replace the first circuit component with the second circuit component based on the delay data of the first circuit component and the delay data of the second circuit component; and a generating unit that generates, when it is determined to replace the first circuit component with the second circuit component at the determining, a directive for replacing the first circuit component with the second circuit component.

A method according to another aspect of the present invention is a method of executing a delay analysis for improving a delay of a target circuit. The method includes: detecting a target path from among a plurality of paths in the target circuit based on a result of a delay analysis of the target circuit, wherein the result of the delay analysis includes delay data of a first circuit component of the target path; extracting delay data of a second circuit component having an identical type to that of the first circuit component; determining whether to replace the first circuit component with the second circuit component based on the delay data of the first circuit component and the delay data of the second circuit component; and generating, when it is determined to replace the first circuit component with the second circuit component at the determining, a directive for replacing the first circuit component with the second circuit component.

A computer-readable recording medium according to still another aspect of the present invention stores therein a computer program that causes a computer to execute the above method.

The other objects, features, and advantages of the present invention are specifically set forth in or will become apparent from the following detailed description of the invention when read in conjunction with the accompanying drawings.

BRIEF DESCRIPTION OF THE DRAWINGS

FIG. 9 is a schematic of an analysis report including a result of a delay analysis of modified paths;

DETAILED DESCRIPTION OF THE PREFERRED EMBODIMENTS

Exemplary embodiments according to the present invention will be explained in detail with reference to the accompanying drawings.

Figure 1:
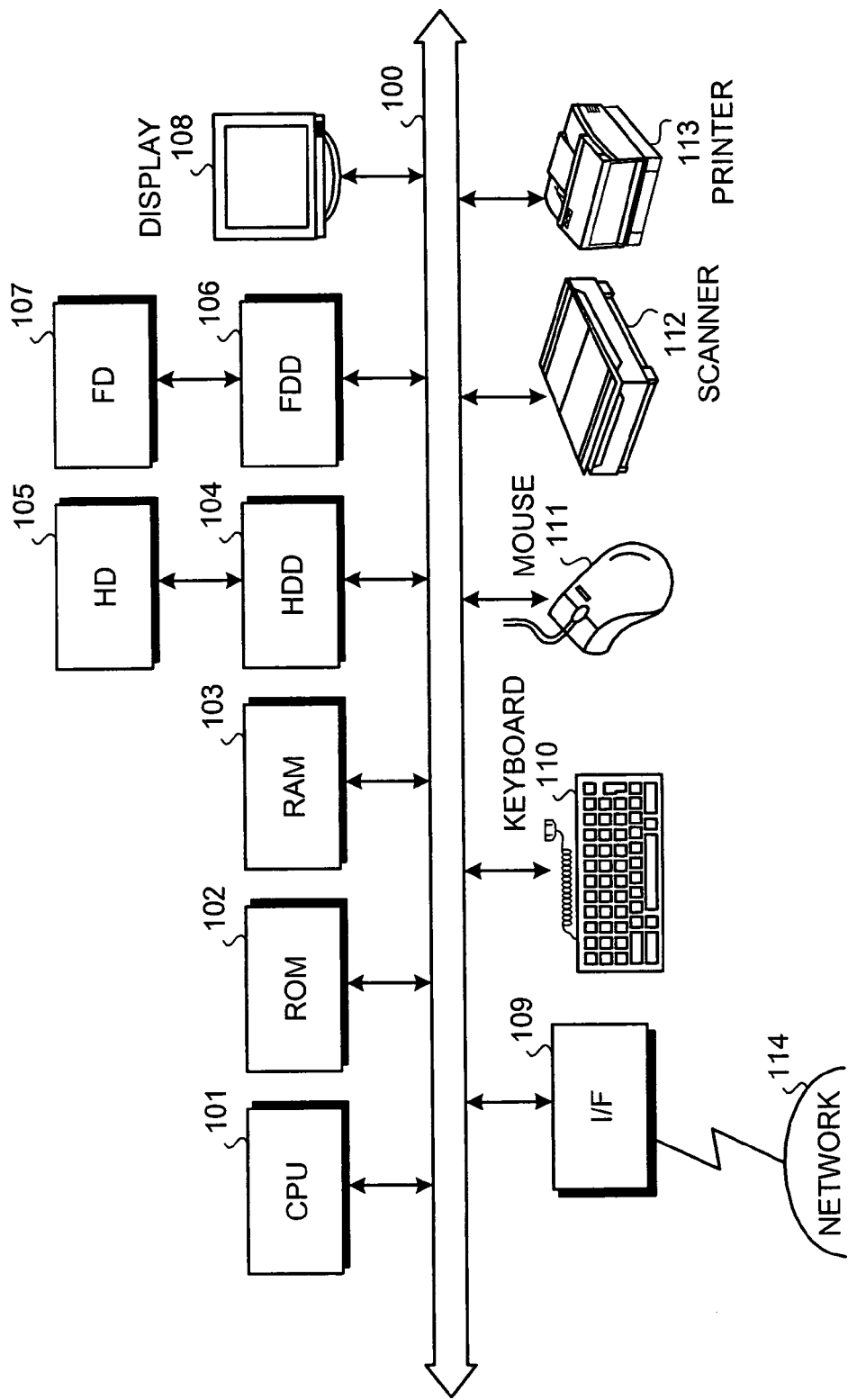
FIG. 1 is a schematic of hardware configuration of a delay analysis apparatus according to an embodiment of the present invention.

FIG. 1 is a schematic of hardware configuration of a delay analysis apparatus according to an embodiment of the present invention. A delay analysis apparatus includes a central processing unit (CPU) 101, a read only memory (ROM) 102, a random access memory (RAM) 103, a hard disk drive (HDD) 104, a hard disk (HD) 105, a flexible disk drive (FDD) 106, a flexible disk (FD) 107 as a removable recording medium, a display 108, an interface (I/F) 109, a keyboard 110, a mouse 111, a scanner 112, and a printer 113. Each unit is connected via a bus 100.

The CPU 101 controls the entire delay analysis apparatus. The ROM 102 stores a program such as a boot program. The RAM 103 is used as a work area of the CPU 101. The HDD 104 controls reading/writing of data from/to the HD 105 under control of the CPU 101. The HD 105 stores data written under control of the HDD 104.

The FDD 106 controls reading/writing of data from/to the FD 107 under control of the CPU 101. The FD 107 stores data written under control of the FDD 106, and causes the delay analysis apparatus to read data written in the FD 107.

A compact-disc read-only memory (CD-ROM), a compact-disc recordable (CD-R), a compact-disc rewritable (CD-RW), a magneto optical (MO) disc, a digital versatile disc (DVD), and a memory card may be used as a removable recording medium besides the FD 107. The display 108 displays not only a cursor, an icon, and a tool box, but also data such as documents, images, information of functions, etc. For example, a cathode-ray tube (CRT), a thin-film transistor (TFT) display, a plasma display can be employed as the display 108.

The I/F 109 is connected to a network 114 such as the Internet via communication lines, and is connected to other devices via the communication lines. The I/F 109 is an interface between the network 114 and the delay analysis apparatus, and controls input/output from/to external sources. For example, a modem and a local area network (LAN) adapter can be employed as the I/F 109.

The keyboard 110 includes plural keys to input characters, numbers, various instructions, etc. An input pad having a touch panel and a numeric key pad can be employed as the keyboard 110. The mouse 111 is for moving a cursor, selecting key range, moving a window, changing the size of a window, etc. A trackball and a joystick that have a similar function as a pointing device may be employed instead of the mouse 111.

The scanner 112 optically reads an image and captures image data into the delay analysis apparatus. The scanner 112 may have a function of optical character recognition (OCR). The printer 113 prints out image data and document data. For example, a laser printer and an ink-jet printer can be employed as the printer 113.

Figure 2:
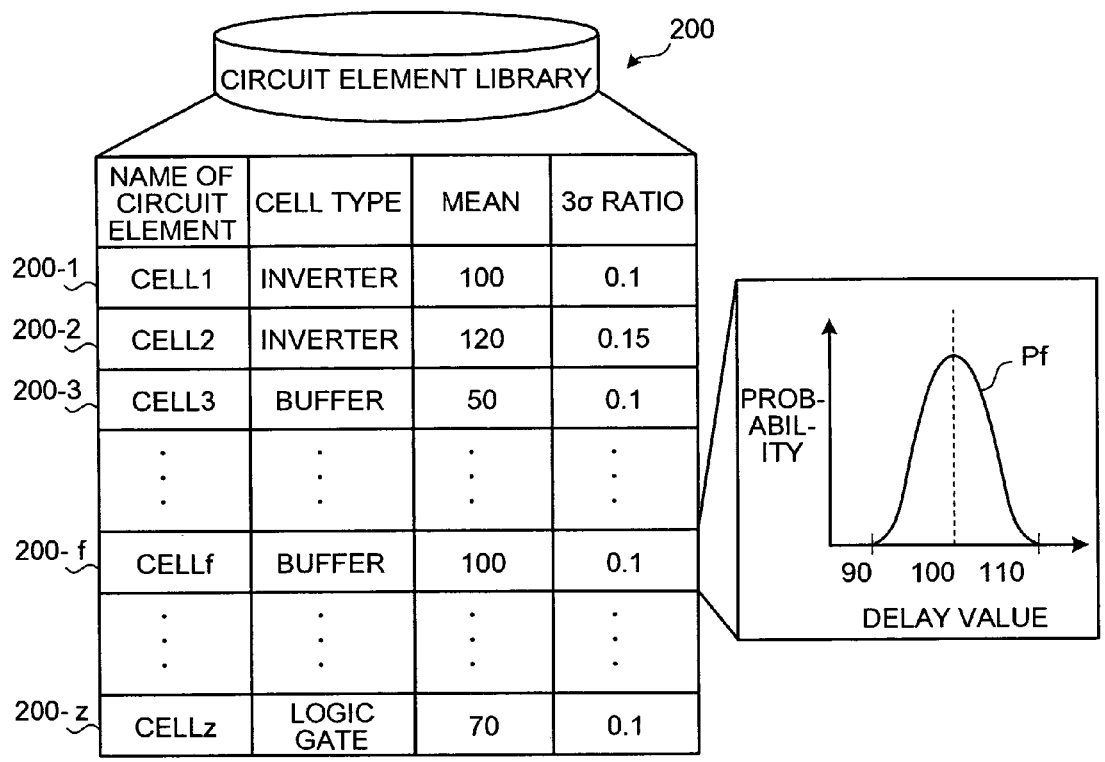
FIG. 2 is a schematic of a circuit element library.

FIG. 2 is a schematic of a circuit element library. A circuit element library 200 stores circuit element delay data 200-1 to 200-z each of which corresponds to each circuit element. Each of the circuit element delay data 200-1 to 200-z includes a name of a circuit element, a cell type, a probability distribution of delay of a circuit element.

The probability distribution of delay of a circuit element may be any arbitrary distribution. For example, the probability distribution may be a normal distribution that can be defined by a mean and a 3σ ratio to the mean, or may be other distribution that can be defined by the approximate expression shown in FIG. 2. It is assumed that the probability distribution Pf of delay of the CELLf, of which cell type is a buffer, is a normal distribution with the mean of 100 and the 3σ ratio of 0.1. The circuit element library 200 is stored in a recording medium such as the ROM 102, the RAM 103, and the HD 105 shown in FIG. 1.

Figure 3:
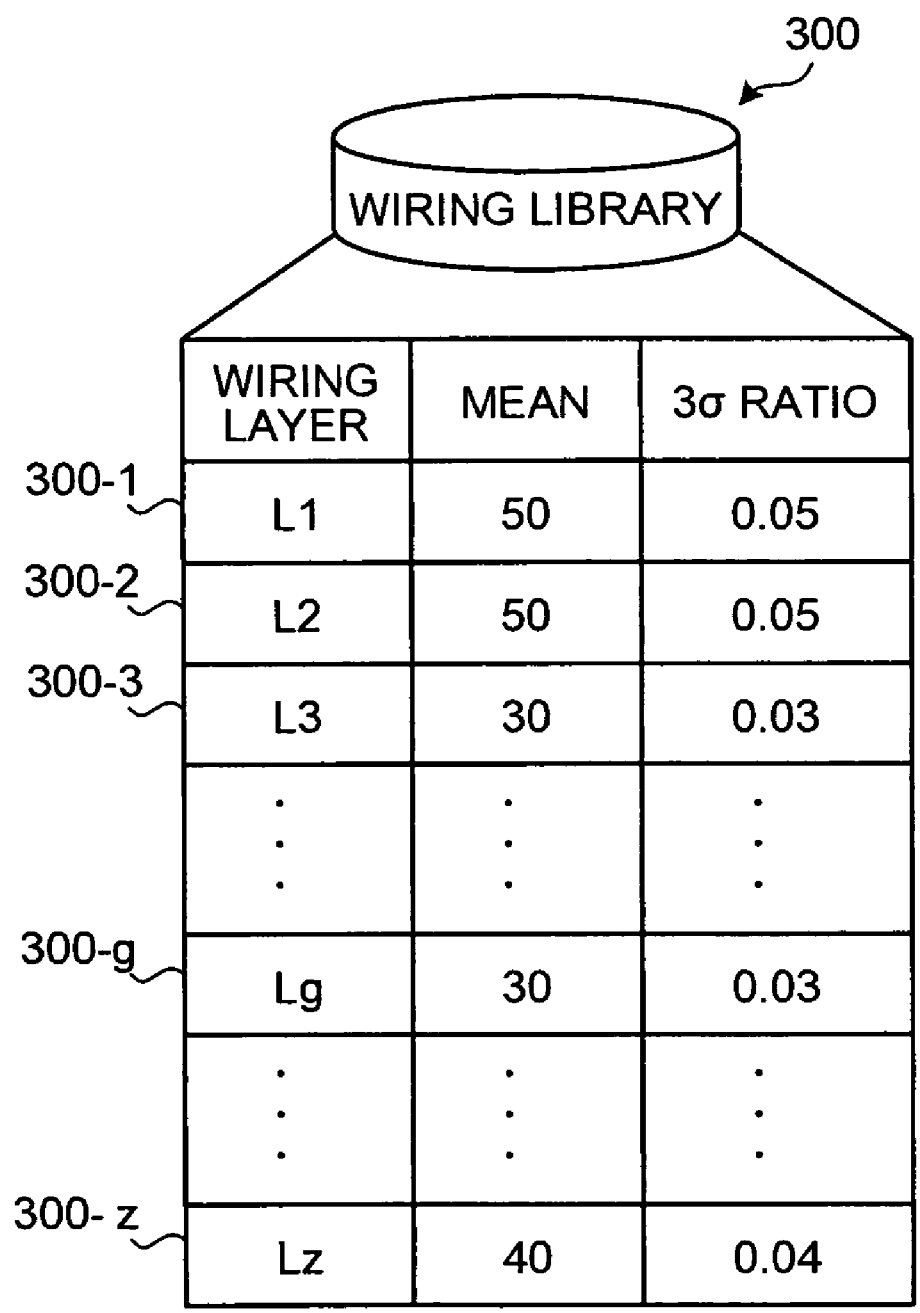
FIG. 3 is a schematic of a wiring library.

FIG. 3 is a schematic of a wiring library. A wiring library 300 stores wiring delay data 300-1 to 300-z each of which corresponds to each wiring. Each of the wiring delay data 300-1 to 300-z includes a wiring layer and a probability distribution of delay of a wiring. The probability distribution of delay of a wiring may also be any distribution. It is assumed that the probability distribution Qg (not shown) of delay of the wiring layer Lg is a normal distribution with the mean of 30 and the 3σ ratio of 0.03. The wiring library 300 is also stored in a recording medium such as the ROM 102, the RAM 103, and the HD 105 shown in FIG. 1.

Figures 4, 5:
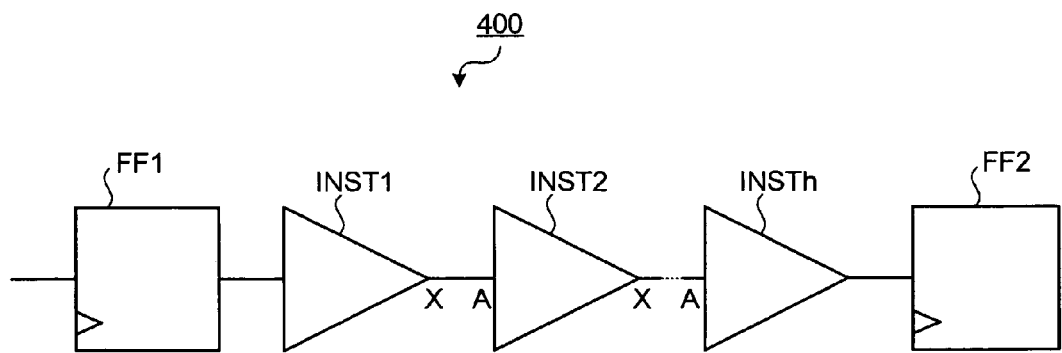
FIG. 4 is a schematic of a target path to be modified.
FIG. 5 is a schematic of an analysis report.

FIG. 4 is a schematic of a target path to be modified. Only a part of a target path is shown in FIG. 4. A target path 400 includes two flop-flops FF1 and FF2, and circuit elements INST1 to INSTh such as a buffer.

FIG. 5 is a schematic of an analysis report. An analysis report 500 is obtained by SSTA or STA of the target circuit. SSTA is a method of optimizing timing yield by statistically treating variations of delay as a probability distribution, whereas STA is a method of calculating delay in the worst case when delays of all gates in a target circuit take the worst possible values. For the accurate calculation of delay, it is preferable to use the result of SSTA than that of STA. Therefore, it is assumed herein that the analysis report 500 is obtained by SSTA.

A reference numeral 501 indicates a start point (i.e. FF1) and an end point (i.e. FF2) of the target path 400. A reference numeral 502 indicates names and input/output terminals of circuit elements in the target path 400. For example, INST1.X indicates an output terminal of INST1, and INST2.A indicates an input terminal of INST2. A reference numeral 503 indicates delay values of circuit elements or wirings. A reference numeral 504 indicates cumulative delay values. Only one target path 400 is described in the analysis report 500, however, all paths in the target circuit may be described in the analysis report 500.

Figure 6:
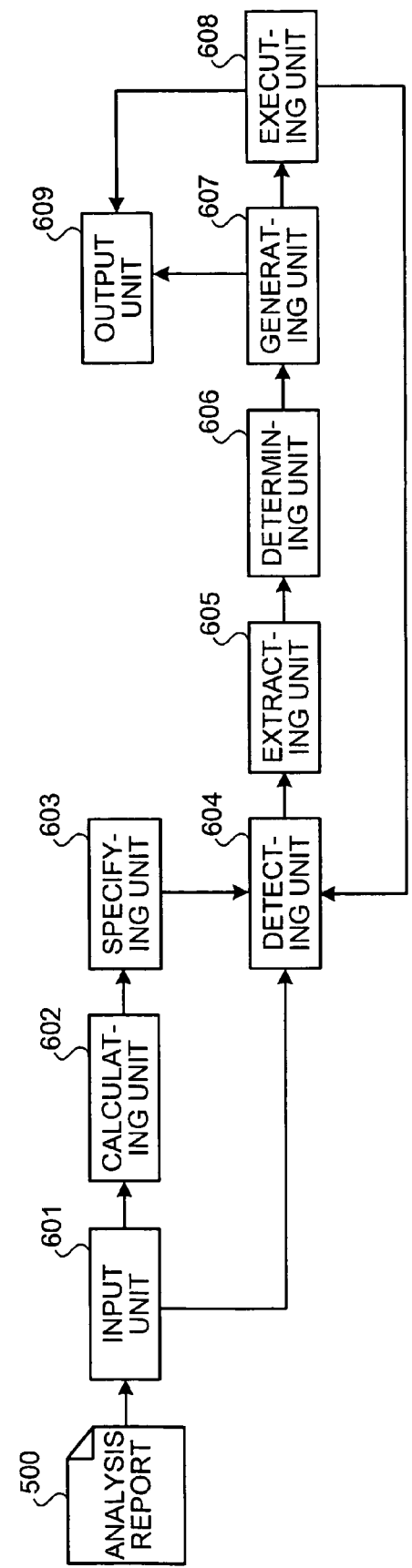
FIG. 6 is a schematic of functional configuration of the delay analysis apparatus.

FIG. 6 is a schematic of functional configuration of the delay analysis apparatus. A delay analysis apparatus 600 includes an input unit 601, a calculating unit 602, a specifying unit 603, a detecting unit 604, an extracting unit 605, a determining unit 606, a generating unit 607, an executing unit 608, and an output unit 609.

The input unit 601 receives an input of the analysis report 500 shown in FIG. 5 and outputs the analysis report 500 to the calculating unit 602.

Figure 7:
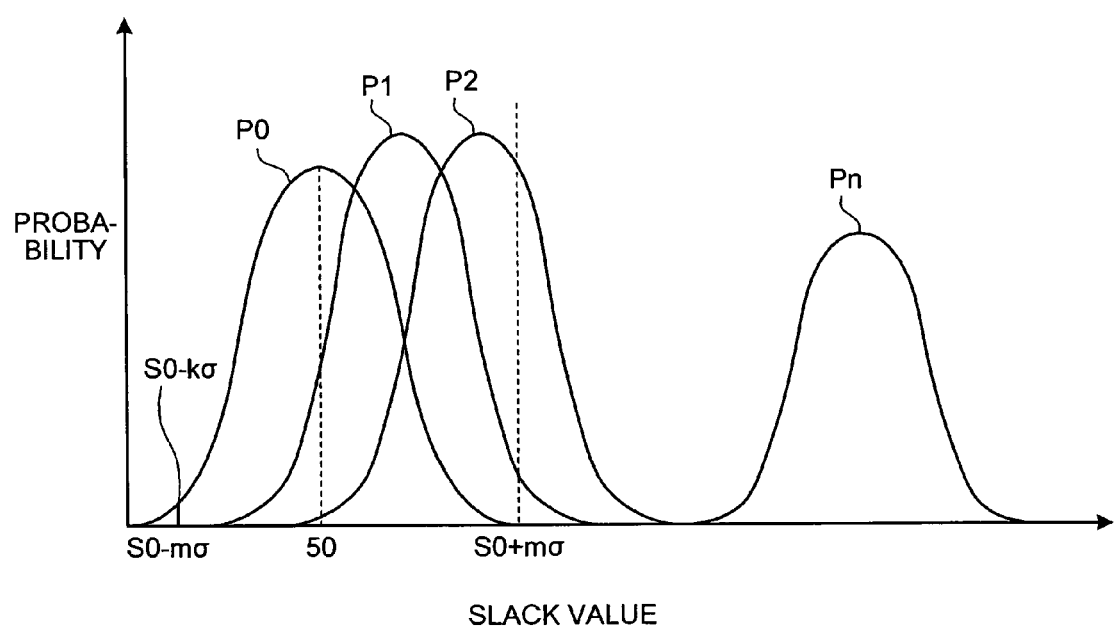
FIG. 7 is a schematic of slack probability distributions.

The calculating unit 602 calculates the slack probability distribution of each path described in the analysis report 500. The calculating unit 602 may calculate the slack probability distribution of each path in a partial circuit generated from the target circuit based on the analysis report 500. FIG. 7 is a schematic of slack probability distributions of paths P0 to Pn in the target circuit.

Referring back to FIG. 6, the specifying unit 603 specifies a reference path that is used as a reference for the selection of the target path(s), based on the characteristics of the slack probability distribution such as the shape thereof and a value obtained therefrom (for example, the mean and the standard deviation of the distribution curve, and the possible range of the slack value). More specifically, the specifying unit 603 specifies the path P0 having the minimum value of (Sn-kσ) among the paths P0 to Pn shown in FIG. 7 as the reference path, where Sn is the mean of the slack probability distribution of path Pn. When there is a plurality of slack probability distributions with the minimum values of (Sn-kσ), the specifying unit 603 may specify a path corresponding to a slack probability distribution with the minimum mean or the maximum standard deviation as the reference path.

The detecting unit 604 detects the target path from the paths P0 to Pn in the target circuit based on the reference path specified by the specifying unit 603. More specifically, the detecting unit 604 detects, as the target path, a path corresponding to a slack probability distribution with the mean Sn or (Sn-mσ) within a predetermined range including the mean S0 of the reference path P0 (for example, the range of S0±mσ, where m is an arbitrary value larger than k). In the example shown in FIG. 7, the detecting unit 604 detects the paths P0, P1, and P2 as the target paths.

The extracting unit 605 calculates the sensitivity of each circuit component (circuit element or wiring) of each target path detected by the detecting unit 604, and extracts, for each of top p (p is an arbitral value set by a user) sensitive circuit components, delay data of a same-type circuit component from the circuit element library 200 or the wiring library 300. The same-type circuit component is a circuit component having the same cell type as the circuit component of the target path. For example, when the circuit element INST2 in the target path is a buffer, the same-type circuit component is CELL3 or CELLf shown in FIG. 2.

The determining unit 606 determines the same-type circuit component as a candidate to replace the sensitive circuit component of the target path, based on the delay data of the sensitive circuit component and the delay data of the same-type circuit component extracted by the extracting unit 605. More specifically, the determining unit 606 compares the delay value of the sensitive circuit component (for example, INST2) with the probability distribution of delay of the same-type circuit component (for example, CELL3), and determines CELL3 as the candidate to replace INST2 if the mean or the 3σ ratio of the probability distribution of delay of CELL3 is smaller than the delay value of INST2. The determining unit 606 may determine a plurality of same-type circuit components as the candidates.

Figure 8:
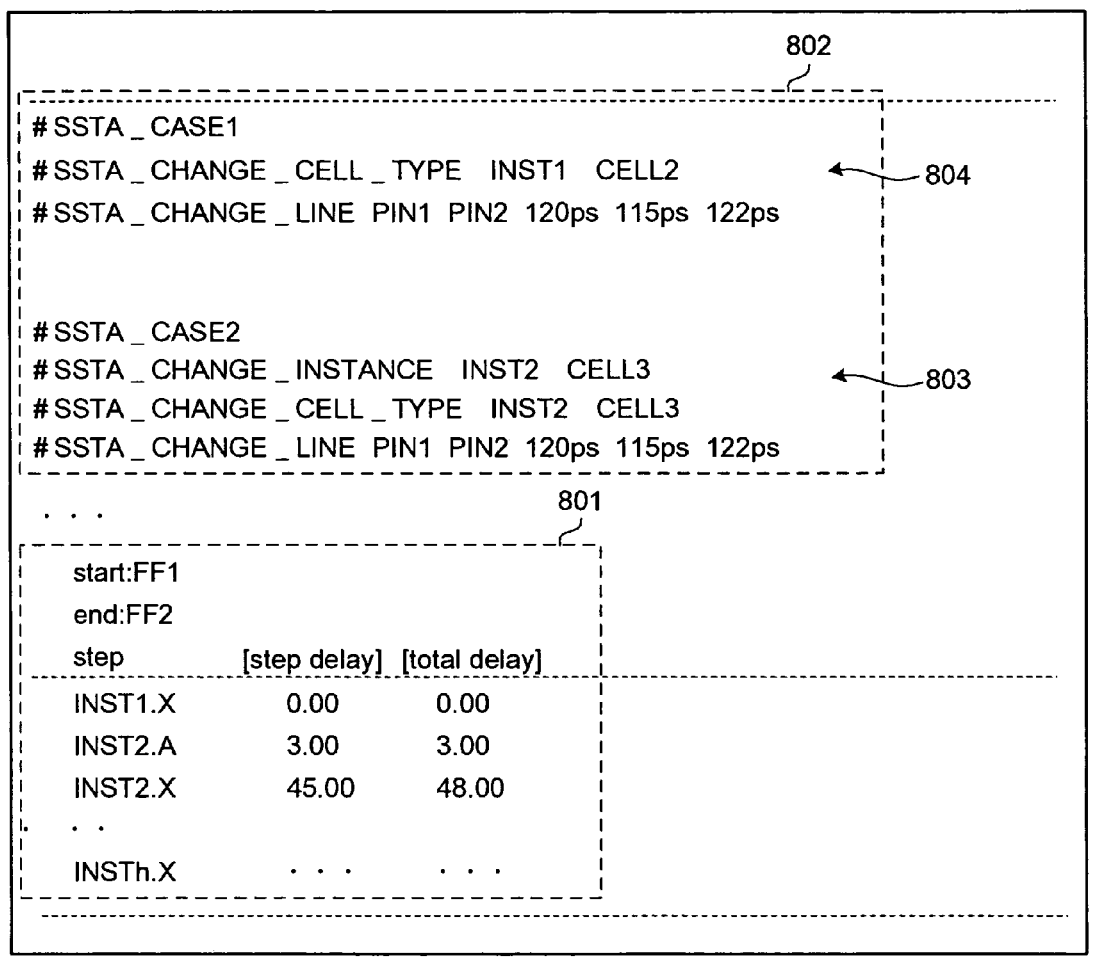
FIG. 8 is a schematic of an analysis report including modification directives.

The generating unit 607 generates a modification directive for replacing the circuit component of the target circuit (for example, INST2) with the candidate determined by the determining unit 606 (for example, CELL3). FIG. 8 is a schematic of the analysis report 500 including two modification directives 802 ("CASE1" and "CASE2") attached to a result of SSTA 801 similar to that shown in FIG. 5. A line 803 in "CASE2" is a command to change INST2 to CELL3, whereas a line 804 in "CASE1" is a command to change the cell type of INST1 to that of CELL2. The modification directive(s) 802 is generated for each target path detected by the detecting unit 604. A separate report including only the modification directive(s) 802 may be generated other than the analysis report 500.

The executing unit 608 executes a statistical delay analysis of the target circuit including the target path modified according to the modification directive (hereinafter, "modified path"). When there is a plurality of modification directives for one target path, the executing unit 608 modifies the target path according to modification directive(s) designated by a user and executes the statistical delay analysis. After that, the executing unit 608 may modify the target path according to other (not selected) modification directive(s) and execute the statistical delay analysis.

The output unit 609 outputs the modification directive generated by the generating unit 607 into the analysis report 500 shown in FIG. 8. The output unit 609 also outputs the result of the delay analysis executed by the executing unit 608 into the analysis report 500 as shown in FIG. 9. A result of the delay analysis 901 shown in FIG. 9 includes delay values of circuit components of the modified path modified according to "CASE1" or "CASE2".

Figure 10:
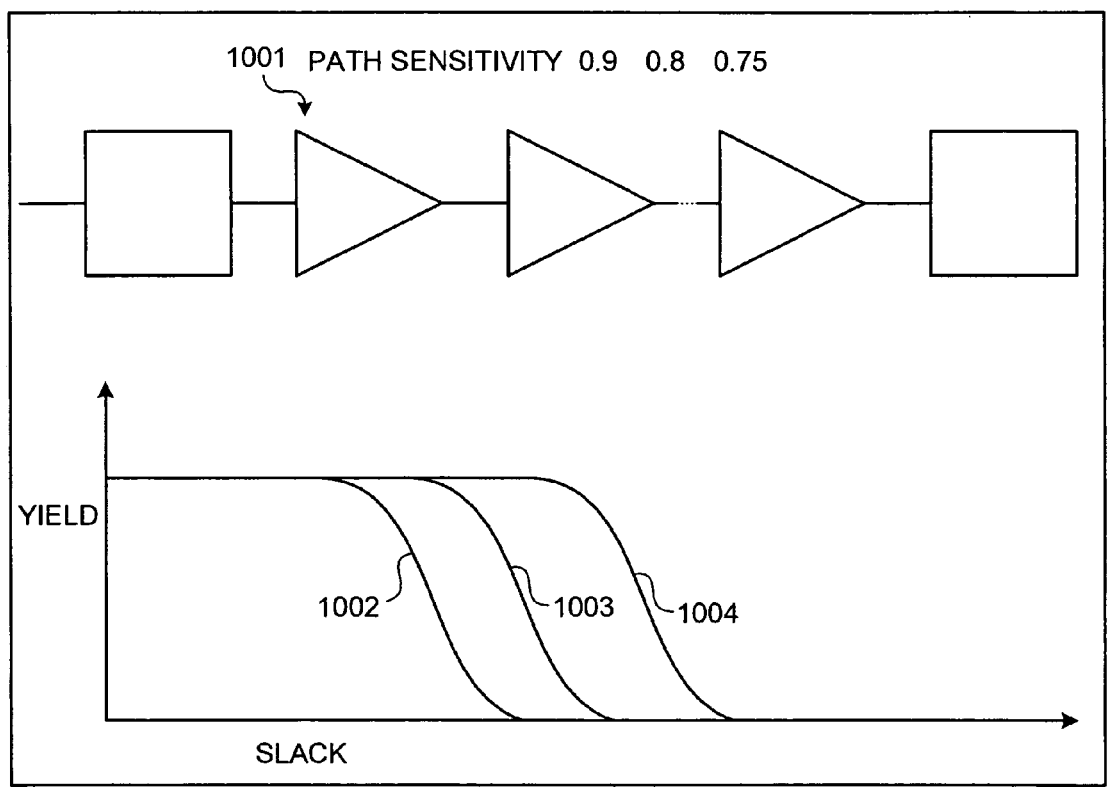
FIG. 10 is a schematic of a display example of the result of the delay analysis.

The output unit 609 may output the result of the delay analysis on the display 108 as shown in FIG. 10. A reference numeral 1001 indicates a target path. Reference numerals 1002, 1003, and 1004 indicate probability distributions of slack yields of the target path before modification, the modified path modified according to "CASE1", and the modified path modified according to "CASE2", respectively. With the result of the delay analysis 901 shown in FIG. 10, a user can identify the most effective modification easily and intuitively, and can determine whether to further modify the target circuit to improve the timing yield.

The input unit 601, the calculating unit 602, the specifying unit 603, the detecting unit 604, the extracting unit 605, the determining unit 606, the generating unit 607, the executing unit 608, and the output unit 609 are realized by the CPU 101 shown in FIG. 1 that executes a program stored in such recording media as ROM 102, RAM 103, HD 105, and FD 107.

Figure 11:
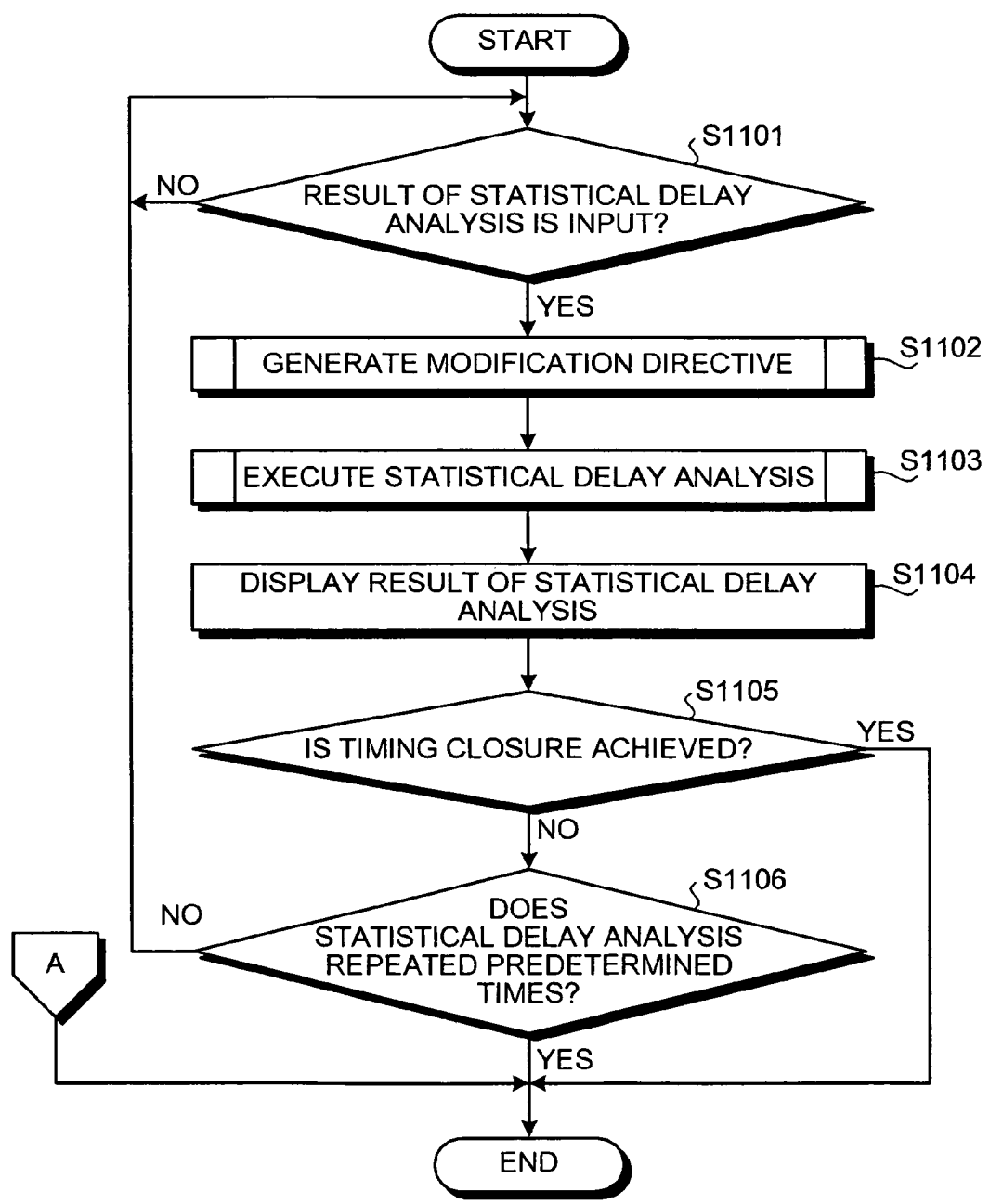
FIG. 11 is a flowchart of a processing performed by the delay analysis apparatus.

FIG. 11 is a flowchart of a processing performed by the delay analysis apparatus according to an embodiment of the present invention. The delay analysis apparatus 600 determines whether a result of statistical delay analysis (the analysis report 500) is input through the input unit 601 (Step S1101). When the result is input (Step S1101: YES), the delay analysis apparatus 600 generates a modification directive (Step S1102), and executes a statistical delay analysis (Step S1103) to output a result of the statistical delay analysis on the display 108 (Step S1104). Then, the delay analysis apparatus 600 determines whether timing closure is achieved (Step S1105) by determining whether the yield exceeds the 3σ value.

When timing closure is achieved (Step S1105: YES), the processing ends there. On the other hand, when timing closure is not achieved (Step S1105: NO), the delay analysis apparatus 600 determines whether the statistical delay analysis is executed a predetermined times (Step S1106). When the statistical delay analysis is executed the predetermined times (Step S1106: YES), the processing ends there. On the other hand, when the statistical delay analysis is not executed the predetermined times (Step S1106: NO), the delay analysis apparatus 600 continues the processing from Step S1101. The above processing can be ended when the delay analysis apparatus 600 receives an instruction from a user to finish the processing.

Figure 12:
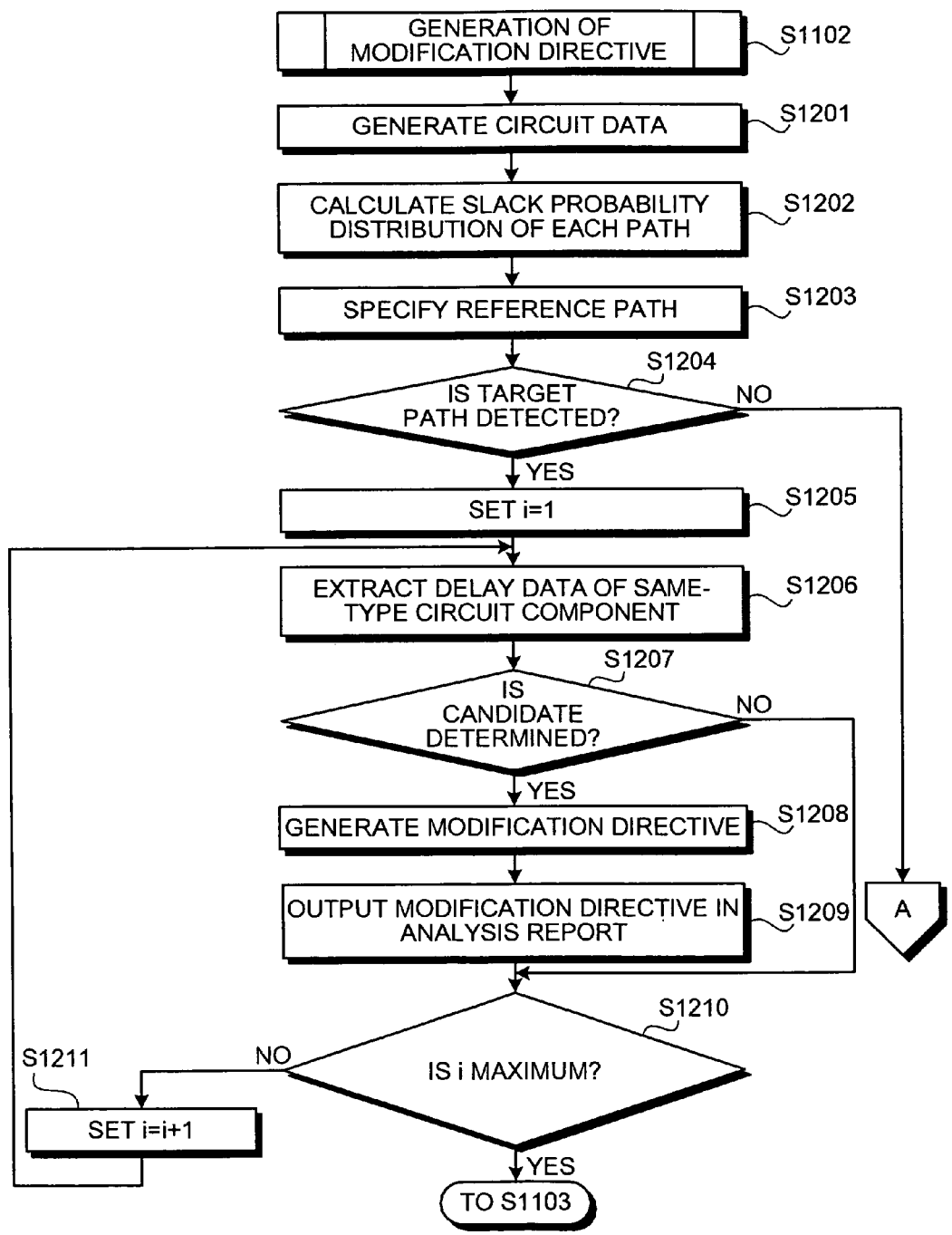
FIG. 12 is a flowchart of a generation of modification directive.

FIG. 12 is a flowchart of a generation of modification directive. The delay analysis apparatus 600 generates a circuit data (Step S1201), and calculates the slack probability distribution of each path in the generated circuit data by the calculating unit 602 (Step S1202). The delay analysis apparatus 600 specifies the reference path, of which slack probability distribution has the minimum value of (Sn-kσ), by the specifying unit 603 (Step S1203).

The delay analysis apparatus 600 determines whether a target path Ri is detected by the detecting unit 604 (Step S1204), where i=1 to n indicates the number of target paths that are detected. When no target path is detected (Step S1204: NO), the processing ends there. On the other hand, when a target path is detected (Step S1204: YES), the delay analysis apparatus 600 sets i=1 (Step S1205).

The delay analysis apparatus 600 extracts, by the extracting unit 605, delay data of a same-type circuit component having the same type as a circuit component of the target path Ri from the circuit element library 200 or the wiring library 300 (Step S1206). Then, the delay analysis apparatus 600 determines whether a candidate is determined by the determining unit 606 (Step S1207).

When no candidate is determined (Step S1207: NO), the processing proceeds to Step S1210. On the other hand, when a candidate is determined (Step S1207: YES), the delay analysis apparatus 600 generates a modification directive by the generating unit 607 (Step S1208), and outputs the modification directive in the analysis report 500 by the output unit 609 (Step S1209).

The delay analysis apparatus 600 determines whether i is the maximum (Step S1210). For example, the maximum i is 100 when the number of the detected target paths is 100.

When i is not the maximum (Step S1210: NO), the delay analysis apparatus 600 increments i (Step S1211), and extracts delay data of a same-type circuit component for the target path Ri (step S1206). On the other hand, when i is the maximum (Step S1210: YES), the processing ends there.

Figure 13:
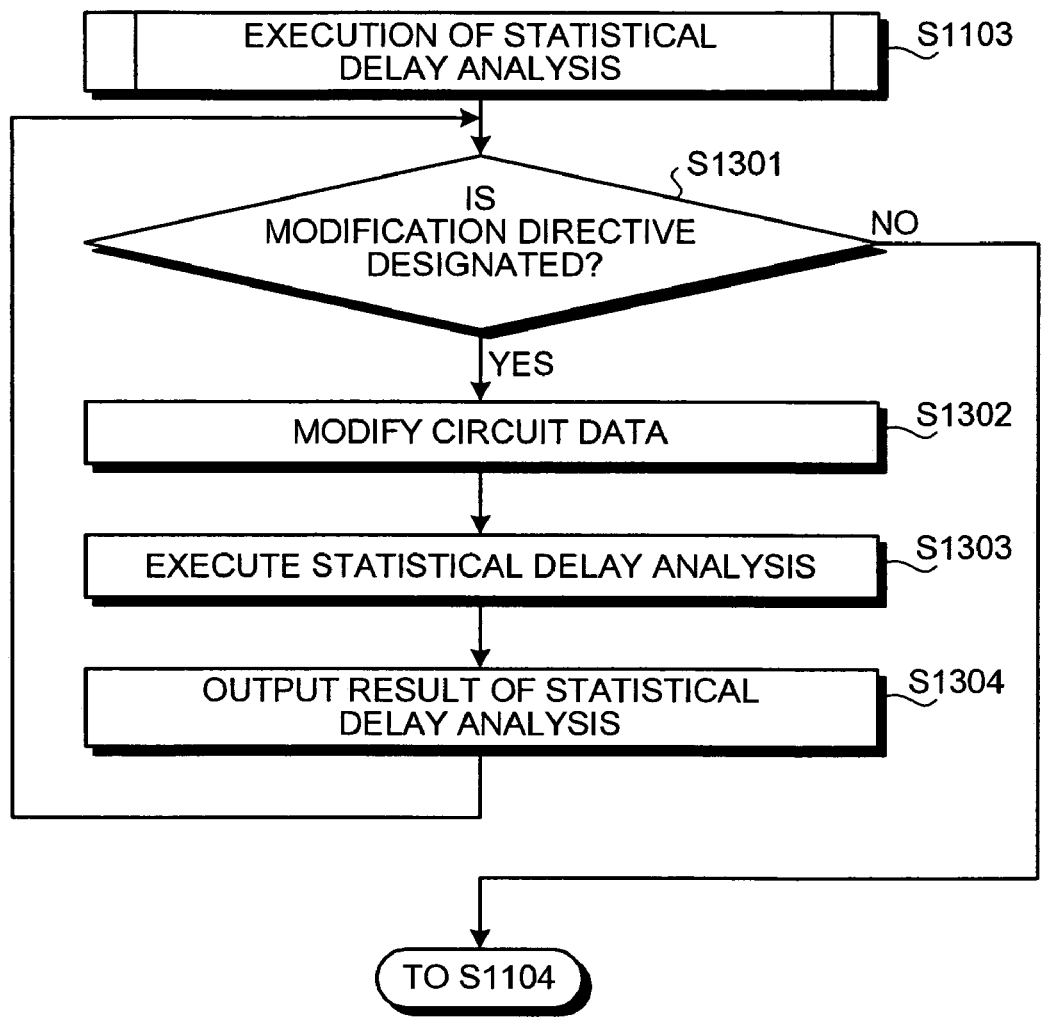
FIG. 13 is a flowchart of an execution of statistical delay analysis.

FIG. 13 is a flowchart of an execution of statistical delay analysis. The delay analysis apparatus 600 determines whether a modification directive is designated (Step S1301). When no modification directive is designated (Step S1301: NO), the processing ends there.

On the other hand, when a modification directive is designated (Step S1301: YES), the delay analysis apparatus 600 modifies the circuit data (in other words, modifies the target path according to the designated modification directive) (Step S1302), and executes the statistical delay analysis for the modified circuit data (Step S1303) by the executing unit 608. Then, the delay analysis apparatus 600 outputs the result of the delay analysis in the analysis report 500 by the output unit 609 (Step S1304). Then, the delay analysis apparatus 600 determines whether another modification directive is designated (Step S1301).

According to the present invention explained above, a user can identify a target path in the target circuit efficiently by referring to the output modification directive. Therefore, it is possible to decrease the number of times of modifying the target path and the number of times of executing the statistical delay analysis.

Furthermore, the user can intuitively understand the effect of modifying the target circuit by referring to the result of the statistical delay analysis executed for the target circuit modified according to the modification directive. Therefore, it is possible to decrease a lord of a designer and to shorten a period of a design by efficiently and accurately executing statistical delay analysis for a target circuit.

The delay analysis method explained above can be realized by the execution of a program prepared in advance by a computer, such as a personal computer, a work station, etc. The program is stored in computer-readable recording medium, such as a hard disk, a flexible disk, a compact disc-read only memory (CD-ROM), a magneto-optical (MO) disk, a digital versatile disc (DVD), etc., and is executed by being read from the recording medium by the computer. The program can be distributed via a network, such as the Internet.

Although the invention has been described with respect to a specific embodiment for a complete and clear disclosure, the appended claims are not to be thus limited but are to be construed as embodying all modifications and alternative constructions that may occur to one skilled in the art that fairly fall within the basic teaching herein set forth.

What is claimed is:

1. A computer-readable recording medium that stores therein a computer program for improving a delay of a target circuit, wherein the computer program causes a computer to execute:

detecting a target path from among a plurality of paths in the target circuit based on a result of a delay analysis of the target circuit, wherein the result of the delay analysis includes delay data of a first circuit component of the target path;

extracting delay data of a second circuit component having an identical type to that of the first circuit component;

determining whether to replace the first circuit component with the second circuit component based on the delay data of the first circuit component and the delay data of the second circuit component;

generating, when it is determined to replace the first circuit component with the second circuit component at the determining, a directive for replacing the first circuit component with the second circuit component;

calculating a plurality of slack probability distributions of the paths based on the result of the delay analysis; and specifying a reference path from among the paths based on the slack probability distributions, wherein the detecting includes detecting, as the target path, a path of which slack probability distribution has a specified relationship to a slack probability distribution of the reference path.

2. The computer-readable recording medium according to claim 1, wherein the computer program further causes the computer to execute:

executing a delay analysis of the target circuit that includes the target path with the first circuit component being replaced with the second circuit component in accordance with the directive; and outputting the result of the delay analysis along with the directive.

3. The computer-readable recording medium according to claim 1, wherein the computer program causes the computer to execute the detecting, the extracting, the determining, and the generating repeatedly until a timing closure is achieved.

4. A method of executing a delay analysis for improving a delay of a target circuit, the method comprising:

detecting a target path from among a plurality of paths in the target circuit based on a result of a delay analysis of the target circuit, wherein the result of the delay analysis includes delay data of a first circuit component of the target path;

extracting delay data of a second circuit component having an identical type to that of the first circuit component;

determining whether to replace the first circuit component with the second circuit component based on the delay data of the first circuit component and the delay data of the second circuit component;

generating, when it is determined to replace the first circuit component with the second circuit component at the determining, a directive for replacing the first circuit component with the second circuit component;

calculating a plurality of slack probability distributions of the paths based on the result of the delay analysis; and specifying a reference path from among the paths based on the slack probability distributions, wherein the detecting includes detecting, as the target path, a path of which slack probability distribution has a specified relationship to a slack probability distribution of the reference path, and at least one of the detecting, extracting, determining, generating, calculating and specifying is performed by a computer.

5. The method according to claim 4, further comprising:

executing a delay analysis of the target circuit that includes the target path with the first circuit component being replaced with the second circuit component in accordance with the directive; and outputting the result of the delay analysis along with the directive.

6. The method according to claim 4, wherein the detecting, the extracting, the determining, and the generating are repeated until a timing closure is achieved.

7. An apparatus that executes a delay analysis for improving a delay of a target circuit, the apparatus comprising:
a detecting unit that detects a target path from among a plurality of paths in the target circuit based on a result of a delay analysis of the target circuit, wherein the result of the delay analysis includes delay data of a first circuit component of the target path;
an extracting unit that extracts delay data of a second circuit component having an identical type to that of the first circuit component;
a determining unit that determines whether to replace the first circuit component with the second circuit component based on the delay data of the first circuit component and the delay data of the second circuit component;
a generating unit that generates, when it is determined to replace the first circuit component with the second circuit component at the determining, a directive for replacing the first circuit component with the second circuit component;
a calculating unit that calculates a plurality of slack probability distributions of the paths based on the result of the delay analysis; and
a specifying unit that specifies a reference path from among the paths based on the slack probability distributions, wherein
the detecting unit detects, as the target path, a path of which slack probability distribution has a specified relationship to a slack probability distribution of the reference path.

8. The apparatus according to claim 7, further comprising:
an executing unit that executes a delay analysis of the target circuit that includes the target path with the first circuit component being replaced with the second circuit component in accordance with the directive; and
an outputting unit that outputs the result of the delay analysis along with the directive.

9. The apparatus according to claim 7, wherein a series of processes performed by the detecting unit, the extracting unit, the determining unit, and the generating unit is repeated until a timing closure is achieved.

* * * * *